(12) United States Patent
Kohda

(10) Patent No.: US 8,212,453 B2
(45) Date of Patent: Jul. 3, 2012

(54) PIEZOELECTRIC RESONATOR DEVICE AND METHOD FOR MANUFACTURING PIEZOELECTRIC RESONATOR DEVICE

(75) Inventor: Naoki Kohda, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 0 days.

(21) Appl. No.: 12/675,419

(22) PCT Filed: Jun. 30, 2009

(86) PCT No.: PCT/JP2009/061937
§ 371 (c)(1),
(2), (4) Date: Feb. 26, 2010

(87) PCT Pub. No.: WO2010/001885
PCT Pub. Date: Jan. 7, 2010

(65) Prior Publication Data
US 2011/0260577 A1   Oct. 27, 2011

(30) Foreign Application Priority Data

Jun. 30, 2008 (JP) .................................. 2008-171091

(51) Int. Cl.
*H01L 41/08* (2006.01)
(52) U.S. Cl. ...................................... 310/344; 29/25.35
(58) Field of Classification Search .................. 310/340, 310/344, 348
See application file for complete search history.

(56) References Cited

U.S. PATENT DOCUMENTS

| 5,430,345 A | * | 7/1995 | Takahashi | 310/348 |
| 6,531,806 B1 | * | 3/2003 | Daidai | 310/344 |
| 6,794,799 B2 | * | 9/2004 | Takeshima et al. | 310/348 |
| 7,589,458 B2 | * | 9/2009 | Aratake | 310/370 |

FOREIGN PATENT DOCUMENTS

| EP | 1 921 662 A1 | 5/2008 |
| JP | 10-335970 A | 12/1998 |
| JP | 2001-144201 A | 5/2001 |
| JP | 3390348 B2 | 3/2003 |
| JP | 2007-048690 A | 2/2007 |
| JP | 2007-165503 A | 6/2007 |
| JP | 2007-274104 A | 10/2007 |

* cited by examiner

*Primary Examiner* — Mark Budd
(74) *Attorney, Agent, or Firm* — Marvin A. Motsenbocker; Mots Law, PLLC

(57) ABSTRACT

A piezoelectric resonator device is provided with a piezoelectric resonator plate, and first and second sealing members that hermetically seal driving electrodes formed on the piezoelectric resonator plate. The piezoelectric resonator plate and the first sealing member are bonded together with a bonding material, and the piezoelectric resonator plate and the second sealing member are bonded together with a bonding material. Also, a multiple-surface bonding portion and a spread preventing portion are provided in at least either of a bonding area between the piezoelectric resonator plate and the first sealing member and a bonding area between the piezoelectric resonator plate and the second sealing member, the multiple-surface bonding portion allowing a bonding material to be bonded to multiple surfaces of different surface orientations, and the spread preventing portion being located on an outer side of the multiple-surface bonding portion and preventing a bonding region bonded to the bonding material from being enlarged.

12 Claims, 12 Drawing Sheets

PIEZOELECTRIC RESONATOR DEVICE AND METHOD FOR MANUFACTURING PIEZOELECTRIC RESONATOR DEVICE

TECHNICAL FIELD

The present invention relates to a piezoelectric resonator device and a method for manufacturing a piezoelectric resonator device.

BACKGROUND ART

The operating frequencies of a variety of electronic equipment have increased in recent years, and with such an increase in operating frequencies, there is also a need for piezoelectric resonator devices (crystal resonators, for example) to take measures against such an increase in operating frequencies.

Many of such kinds of piezoelectric resonator devices have a casing in the form of a rectangular parallelepiped package. Such a package is configured with first and second sealing members of glass and a crystal resonator plate of quartz that has driving electrodes formed on both major surfaces. The first sealing member and the second sealing member are laminated and bonded together via the crystal resonator plate so as to hermetically seal the driving electrodes of the crystal resonator plate provided inside the package (see Patent Document 1 below, for example).

PRIOR ART DOCUMENT

Patent Document

Patent Document 1: Japanese Patent No. 3390348

SUMMARY OF INVENTION

Problem to be Solved by the Invention

Now, if the first sealing member and the second sealing member are made of glass and bonded together with a bonding material via the crystal resonator plate as disclosed in Patent Document 1, the bonding material may be squeezed and spread over the bonding surfaces (both of the major surfaces) of the crystal resonator plate and the bonding surfaces of the first sealing member and the second sealing member in a direction along the bonding surfaces (in a direction along the planes), and such a spread bonding material may be thereby squeezed out of the end face of the package or may enter the internal space of the package.

If the bonding material is squeezed out of the end face of the package, it will prevent a size reduction in the package. If the bonding material enters the internal space of the package, it may come into contact with the piezoelectric resonator plate held in the internal space, giving an adverse effect on the vibration characteristics.

Moreover, since glass and quartz have smoother surfaces than ceramic, for example, their bonding surfaces are more likely to allow the spread of such a bonding material.

To solve the above-described problem, an object of the present invention is to provide a piezoelectric resonator device that prevents a bonding material from spreading over the bonding surfaces in a direction along the bonding surfaces (in a direction along the planes) when the first sealing member and the second sealing member are bonded together so as to hermetically seal the driving electrodes of the piezoelectric resonator plate, and is also to provide a method for manufacturing such a piezoelectric resonator device.

Means for Solving the Problems

To attain the above-described object, a piezoelectric resonator device that generates piezoelectric resonance, according to the present invention, includes a piezoelectric resonator plate that is made of a piezoelectric material and has driving electrodes formed on both its major surfaces; a first sealing member that hermetically seals the driving electrode formed on one of the major surfaces of the piezoelectric resonator plate; and a second sealing member that hermetically seals the driving electrode formed on the other major surface of the piezoelectric resonator plate, wherein the piezoelectric resonator plate and the first sealing member are bonded together with a bonding material; the piezoelectric resonator plate and the second sealing member are bonded together with a bonding material; and a multiple-surface bonding portion and a spread preventing portion are provided in at least either of a bonding area between the piezoelectric resonator plate and the first sealing member and a bonding area between the piezoelectric resonator plate and the second sealing member, the multiple-surface bonding portion allowing the bonding material to be bonded to a plurality of surfaces of different surface orientations, the spread preventing portion being located on an outer side of the multiple-surface bonding portion and preventing a bonding region bonded to the bonding material from being enlarged.

According to the present invention, the provision of the multiple-surface bonding portion and the spread preventing portion can prevent the bonding material from spreading over the bonding surfaces in the direction along the bonding surfaces (in the direction along the planes) when the first sealing member and the second sealing member are indirectly bonded together so as to hermetically seal the driving electrodes of the piezoelectric resonator plate. Specifically, according to the present invention, when the first sealing member and the second sealing member are bonded together with a bonding material via the piezoelectric resonator plate, the bonding material can be prevented from spreading over the bonding surfaces (both of the major surfaces) of the piezoelectric resonator plate and the bonding surfaces of the first sealing member and the second sealing member in the direction along the bonding surfaces (in the direction along the planes).

The phenomenon of such spreading of the bonding material (wetting) in the bonding area is a natural result of heat/melt bonding with the bonding material; however, according to the present invention, even if the bonding material spreads over the bonding area, the provision of the multiple-surface bonding portion and the spread preventing portion can prevent the bonding material from being squeezed out of the end face of the piezoelectric resonator device and also prevents the bonding material from entering the internal space of the piezoelectric resonator device. Moreover, according to the present invention, the provision of the multiple-surface bonding portion and the spread preventing portion allows the bonding material to be bonded to a plurality of surfaces of different surface orientations, bringing about an anchor effect and thereby improving the strength of bonding between the piezoelectric resonator plate and the first and second sealing members.

To attain the above-described object, in a piezoelectric resonator device that generates piezoelectric resonance according to the present invention, a first sealing member and a second sealing member are laminated and bonded together via a piezoelectric resonator plate that is made of a piezoelectric material and that has driving electrodes formed on both its major surfaces, the first sealing member hermetically sealing the driving electrode formed on one of major surfaces of the piezoelectric resonator plate, the second sealing member hermetically sealing the driving electrode formed on the other major surface of the piezoelectric resonator plate; a first bonding material for bonding the first sealing member and a second bonding material for bonding the second sealing member are formed on bonding surfaces of the piezoelectric resonator plate; a third bonding material for bonding the piezoelectric resonator plate is formed on a bonding surface of the first sealing member; a fourth bonding material for bonding the piezoelectric resonator plate is formed on a bonding surface of the second sealing member; the first bonding material and the third bonding material are bonded together to form a bonding material, with which the piezoelectric resonator plate and the first sealing member are bonded together so as to hermetically seal the driving electrode formed on one of the major surfaces of the piezoelectric resonator plate; the second bonding material and the fourth bonding material are bonded together to form a bonding material, with which the piezoelectric resonator plate and the second sealing member are bonded together so as to hermetically seal the driving electrode formed on the other major surface of the piezoelectric resonator plate; and a multiple-surface bonding portion and a spread preventing portion are provided in at least either of a bonding area between the piezoelectric resonator plate and the first sealing member and a bonding area between the piezoelectric resonator plate and the second sealing member, the multiple-surface bonding portion allowing the bonding material to be bonded to a plurality of surfaces of different surface orientations, the spread preventing portion being located on an outer side of the multiple-surface bonding portion and preventing a bonding region bonded to the bonding material from being enlarged.

According to the present invention, the provision of the multiple-surface bonding portion and the spread preventing portion can prevent the bonding material from spreading over the bonding surfaces in the direction along the bonding surfaces (in the direction along the planes) when the first sealing member and the second sealing member are indirectly bonded together so as to hermetically seal the driving electrodes of the piezoelectric resonator plate. Specifically, according to the present invention, when the first sealing member and the second sealing member are bonded together with a bonding material via the piezoelectric resonator plate, the bonding material can be prevented from spreading over the bonding surfaces (both of the major surfaces) of the piezoelectric resonator plate and the bonding surfaces of the first sealing member and the second sealing member in the direction along the bonding surfaces (in the direction along the planes).

The phenomenon of such spreading of the bonding material (wetting) in the bonding area is a natural result of heat/melt bonding with the bonding material; however, according to the present invention, even if the bonding material spreads over the bonding area, the provision of the multiple-surface bonding portion and the spread preventing portion can prevent the bonding material from being squeezed out of the end face of the piezoelectric resonator device and also prevents the bonding material from entering the internal space of the piezoelectric resonator device. Moreover, according to the present invention, the provision of the multiple-surface bonding portion and the spread preventing portion allows a bonding material to be bonded to a plurality of surfaces of different surface orientations, bringing about an anchor effect and thereby improving the strength of bonding between the piezoelectric resonator plate and the first and second sealing members.

In the above-described configuration, a bonding region of the first bonding material on the bonding surface of the piezoelectric resonator plate and a bonding region of the third bonding material on the bonding surface of the first sealing member may have the same width, and a bonding region of the second bonding material on the bonding surface of the piezoelectric resonator plate and a bonding region of the fourth bonding material on the bonding surface of the second sealing member may have the same width.

In this case, since the bonding region of the first bonding material on the bonding surface of the piezoelectric resonator plate and the bonding region of the third bonding material on the bonding surface of the first sealing member have the same width, and since the bonding region of the second bonding material on the bonding surface of the piezoelectric resonator plate and the bonding region of the fourth bonding material on the bonding surface of the second sealing member have the same width, even if any misalignment in the bonding positions occurs during bonding of the piezoelectric resonator plate, the first sealing member, and the second sealing member, a self-alignment effect can be produced. In other words, it is possible to eliminate misalignment in the bonding positions.

To attain the above-described object, a piezoelectric resonator device that generates piezoelectric resonance, according to the present invention, includes a piezoelectric resonator plate that is made of a piezoelectric material and that has driving electrodes formed on both its major surfaces; a first sealing member that is equipped with the piezoelectric resonator plate; and a second sealing member that is bonded to the first sealing member with a bonding material so as to hermetically seal the driving electrodes of the piezoelectric resonator plate, wherein the first sealing member and the second sealing member are bonded together with the bonding material; and a multiple-surface bonding portion and a spread preventing portion are provided in a bonding area between the first sealing member and the second sealing member, the multiple-surface bonding portion allowing the bonding material to be bonded to a plurality of surfaces of different surface orientations, the spread preventing portion being located on an outer side of the multiple-surface bonding portion and preventing a bonding region bonded to the bonding material from being enlarged.

According to the present invention, the provision of the multiple-surface bonding portion and the spread preventing portion can prevent the bonding material from spreading over the bonding surfaces in the direction along the bonding surfaces (in the direction along the planes) when the first sealing member and the second sealing member are directly bonded together so as to hermetically seal the driving electrodes of the piezoelectric resonator plate. Specifically, according to the present invention, when the first sealing member and the second sealing member are bonded together with a bonding material via the piezoelectric resonator plate, the bonding material can be prevented from spreading over the bonding surfaces (both of the major surfaces) of the piezoelectric resonator plate and the bonding surfaces of the first sealing member and the second sealing member in the direction along the bonding surfaces (in the direction along the planes).

The phenomenon of such spreading of the bonding material (wetting) in the bonding area is a natural result of heat/melt bonding with the bonding material; however, according to the present invention, even if the bonding material spreads over the bonding area, the provision of the multiple-surface bonding portion and the spread preventing portion can prevent the bonding material from being squeezed out of the end face of the piezoelectric resonator device and also prevents the bonding material from entering the internal space of the piezoelectric resonator device. Moreover, according to the present invention, the provision of the multiple-surface bonding portion and the spread preventing portion allows the bonding material to be bonded to a plurality of surfaces of different surface orientations, bringing about an anchor effect and thereby improving the strength of bonding between the piezoelectric resonator plate and the first and second sealing members.

To attain the above-described object, a piezoelectric resonator device that generates piezoelectric resonance, according to the present invention, includes a piezoelectric resonator plate that is made of a piezoelectric material and has driving electrodes formed on both its major surfaces; a first sealing member that is equipped with the piezoelectric resonator plate; and a second sealing member that is bonded to the first sealing member with a bonding material so as to hermetically seal the driving electrodes of the piezoelectric resonator plate, wherein a fifth bonding material for bonding the second sealing member is formed on a bonding surface of the first sealing member; a sixth bonding material for bonding the first sealing member is formed on a bonding surface of the second sealing member; a multiple-surface bonding portion and a spread preventing portion are provided in a bonding area between the first sealing member and the second sealing member, the multiple-surface bonding portion allowing the bonding material to be bonded to a plurality of surfaces of different surface orientations, the spread preventing portion being located on an outer side of the multiple-surface bonding portion and preventing a bonding region bonded to the bonding material from being enlarged; and the fifth bonding material and the sixth bonding material are bonded together to form the bonding material, with which the first sealing member and the second sealing member are bonded together so as to hermetically seal the driving electrodes formed on the piezoelectric resonator plate.

According to the present invention, the provision of the multiple-surface bonding portion and the spread preventing portion can prevent the bonding material from spreading over the bonding surfaces in the direction along the bonding surfaces (in the direction along the planes) when the first sealing member and the second sealing member are directly bonded together so as to hermetically seal the driving electrodes of the piezoelectric resonator plate. Specifically, according to the present invention, when the first sealing member and the second sealing member are bonded together with a bonding material via the piezoelectric resonator plate, the bonding material can be prevented from spreading over the bonding surfaces (both of the major surfaces) of the piezoelectric resonator plate and the bonding surfaces of the first sealing member and the second sealing member in the direction along the bonding surfaces (in the direction along the planes).

The phenomenon of such spreading of the bonding material (wetting) in the bonding area is a natural result of heat/melt bonding with the bonding material; however, according to the present invention, even if the bonding material spreads over the bonding area, the provision of the multiple-surface bonding portion and the spread preventing portion can prevent the bonding material from being squeezed out of the end face of the piezoelectric resonator device and also prevents the bonding material from entering the internal space of the piezoelectric resonator device. Moreover, according to the present invention, the provision of the multiple-surface bonding portion and the spread preventing portion allows the bonding material to be bonded to a plurality of surfaces of different surface orientations, bringing about an anchor effect and thereby improving the strength of bonding between the piezoelectric resonator plate and the first and second sealing members.

In the above-described configuration, a bonding region of the fifth bonding material on the bonding surface of the first sealing member and a bonding region of the sixth bonding material on the bonding surface of the second sealing member may have the same width.

In this case, since the bonding region of the fifth bonding material on the bonding surface of the first sealing member and the bonding region of the sixth bonding material on the bonding surface of the second sealing member have the same width, even if any misalignment in the bonding positions occurs during bonding of the piezoelectric resonator plate, the first sealing member, and the second sealing member, a self-alignment effect can be produced. In other words, it is possible to eliminate misalignment in the bonding positions.

In the above-described configuration, a multiple-surface bonding portion and a spread preventing portion may be provided in the bonding area between the piezoelectric resonator plate and the first sealing member and in the bonding area between the piezoelectric resonator plate and the second sealing member, the multiple-surface bonding portion allowing the bonding material to be bonded to a plurality of surfaces of different surface orientations, the spread preventing portion being located on an outer side of a bonding area using the bonding material and preventing a bonding region bonded to the bonding material from being enlarged.

In this case, since the multiple-surface bonding portion and the spread preventing portion are provided in the bonding area between the piezoelectric resonator plate and the first sealing member and in the bonding area between the piezoelectric resonator plate and the second sealing member, it forms a suitable configuration for preventing the bonding material from spreading over the bonding surfaces (both of the major surfaces) of the piezoelectric resonator plate and the bonding surfaces of the first sealing member and the second sealing member in the direction along the bonding surfaces (in the direction along the planes) when the first sealing member and the second sealing member are bonded together with the bonding material via the piezoelectric resonator plate. Such a configuration is also suitable for improving the bonding strength because it allows the bonding material to be bonded to a plurality of surfaces of different surface orientations and to thereby produce an anchor effect in all the bonding areas.

In the above-described configuration, the multiple-surface bonding portion may be a protruding portion that has a plurality of surfaces and is formed in at least either of the bonding area between the piezoelectric resonator plate and the first sealing member and the bonding area between the piezoelectric resonator plate and the second sealing member, and the bonding material may be bonded to a plurality of surfaces that include an end face of the protruding portion.

In this case, since the multiple-surface bonding portion is the protruding portion having a plurality of surfaces and the bonding material is bonded to a plurality of surfaces including an end face of the protruding portion, it is possible to bond the bonding material to a plurality of continuous surfaces of different surface orientations, thus readily producing an anchor effect.

In the above-described configuration, the spread preventing portion may be a recessed portion formed on an outer side of the multiple-surface bonding portion.

In this case, since the spread preventing portion is the recessed portion formed on an outer side of the multiple-surface bonding portion, it is possible according to the present invention to prevent the bonding material from flowing to (wetting) the end face of the piezoelectric resonator device and to prevent the bonding material from entering the internal space of the piezoelectric resonator device, even if the bonding material spreads over the bonding area after bonding.

In the above-described configuration, the spread preventing portion may be a protruding wall portion formed on an outer side of the multiple-surface bonding portion.

In this case, since the spread preventing portion is the protruding wall portion formed on an outer side of the multiple-surface bonding portion, it is possible according to the present invention to prevent the bonding material from flowing to (wetting) the end face of the piezoelectric resonator device and to prevent the bonding material from entering the internal space of the piezoelectric resonator device, even if the bonding material spreads over the bonding area after bonding.

In the above-described configuration, the spread preventing portion may be a metal film formed on an outer side of the multiple-surface bonding portion.

In this case, since the spread preventing portion is a metal film formed on an outer side of the multiple-surface bonding portion, it is possible to prevent the bonding material from being diffused physically. Moreover, since the spread preventing portion is a metal film formed on an outer side of the multiple-surface bonding portion, it is also possible to allow countermeasures against EMI to be taken with the piezoelectric resonator device and further to complement the strength of the member having the metal film formed thereon. Still more, if the metal film is made of a material such as Ni or Cr that hardly wets the bonding material, it is possible to prevent the bonding material from wetting (flowing).

In the above-described configuration, the bonding surfaces of the piezoelectric resonator plate, the first sealing member, and the second sealing member in the bonding areas may be smooth surfaces.

In this case, since the bonding surfaces of the piezoelectric resonator plate, the first sealing member, and the second sealing member in the bonding areas are smooth surfaces, the bonding material is likely to flow (wet) in the bonding areas; however, even in such a case, it is possible to prevent the bonding material from flowing to (wetting) the end face of the piezoelectric resonator device and to prevent the bonding material from entering the internal space of the piezoelectric resonator device.

To attain the above-described object, a method for manufacturing a piezoelectric resonator device that generates piezoelectric resonance, according to the present invention, includes laminating and bonding a first sealing member and a second sealing member via a piezoelectric resonator plate that is made of a piezoelectric material and has driving electrodes formed on both its major surfaces, the first sealing member hermetically sealing the driving electrode formed on one of the major surfaces of the piezoelectric resonator plate, the second sealing member hermetically sealing the driving electrode formed on the other major surface of the piezoelectric resonator plate; providing a multiple-surface bonding portion and a spread preventing portion in at least either of a bonding area between the piezoelectric resonator plate and the first sealing member and a bonding area between the piezoelectric resonator plate and the second sealing member, the multiple-surface bonding portion allowing a bonding material to be bonded to a plurality of surfaces of different surface orientations, the spread preventing portion being located on an outer side of the multiple-surface bonding portion and preventing a bonding region bonded to the bonding material from being enlarged forming a first bonding material for bonding the first sealing member and a second bonding material for bonding the second sealing member on bonding surfaces of the piezoelectric resonator plate; forming a third bonding material for bonding the piezoelectric resonator plate on a bonding surface of the first sealing member; forming a fourth bonding material for bonding the piezoelectric resonator plate on a bonding surface of the second sealing member; bonding the first bonding material and the third bonding material to form the bonding material, with which the piezoelectric resonator plate and the first sealing member are bonded together so as to hermetically seal the driving electrode formed on one of the major surfaces of the piezoelectric resonator plate; and bonding the second bonding material and the fourth bonding material to form the bonding material, with which the piezoelectric resonator plate and the second sealing member are bonded together so as to hermetically seal the driving electrode formed on the other major surface of the piezoelectric resonator plate.

According to the present invention, the provision of the multiple-surface bonding portion and the spread preventing portion can prevent the bonding material from spreading over the bonding surfaces in the direction along the bonding surfaces (in the direction along the planes) when the first sealing member and the second sealing member are indirectly bonded together so as to hermetically seal the driving electrodes of the piezoelectric resonator plate. Specifically, according to the present invention, when the first sealing member and the second sealing member are bonded together with the bonding material via the piezoelectric resonator plate, the bonding material can be prevented from spreading over the bonding surfaces (both of the major surfaces) of the piezoelectric resonator plate and the bonding surfaces of the first sealing member and the second sealing member in the direction along the bonding surfaces (in the direction along the planes).

The phenomenon of such spreading of the bonding material (wetting) in the bonding area is a natural result of heat/melt bonding with the bonding material; however, according to the present invention, even if the bonding material spreads over the bonding area, it is possible to prevent the bonding material from being squeezed out of the end face of the piezoelectric resonator device and to prevent the bonding material from entering the internal space of the piezoelectric resonator device. Moreover, the present invention enables the bonding material to be bonded to a plurality of surfaces of different surface orientations, bringing about an anchor effect and thereby improving the bonding strength.

In the above-described method, a bonding region of the first bonding material on the bonding surface of the piezoelectric resonator plate and a bonding region of the third bonding material on the bonding surface of the first sealing member may have the same width, and a bonding region of the second bonding material on the bonding surface of the piezoelectric resonator plate and a bonding region of the fourth bonding material on the bonding surface of the second sealing member may have the same width.

In this case, since the bonding region of the first bonding material on the bonding surface of the piezoelectric resonator plate and the bonding region of the third bonding material on the bonding surface of the first sealing member have the same width, and the bonding region of the second bonding material on the bonding surface of the piezoelectric resonator plate and the bonding region of the fourth bonding material on the bonding surface of the second sealing member have the same width, even if any misalignment in the bonding positions occurs during bonding of the piezoelectric resonator plate, the first sealing member, and the second sealing member, a self-alignment effect can be produced. In other words, it is possible to eliminate misalignment in the bonding positions.

Moreover, to attain the above-described object, a method for manufacturing a piezoelectric resonator device that generates piezoelectric resonance according to the present invention, includes bonding a first sealing member and a second sealing member with a bonding material, the first sealing member being equipped with a piezoelectric resonator plate that is made of a piezoelectric material and has driving electrodes formed on both its major surfaces, the second sealing member hermetically sealing the driving electrodes of the piezoelectric resonator plate; providing a multiple-surface bonding portion and a spread preventing portion in a bonding area between the first sealing member and the second sealing member, the multiple-surface bonding portion allowing the bonding material to be bonded to a plurality of surfaces of different surface orientations, the spread preventing portion being located on an outer side of the multiple-surface bonding portion and preventing a bonding region bonded to the bonding material from being enlarged; forming a fifth bonding material for bonding the second sealing member on a bonding surface of the first sealing member; forming a sixth bonding material for bonding the first sealing member on a bonding surface of the second sealing member; and bonding the fifth bonding material and the sixth bonding material to form the bonding material, with which the first sealing member and the second sealing member are bonded together so as to hermetically seal the driving electrodes formed on the piezoelectric resonator plate.

According to the present invention, the provision of the multiple-surface bonding portion and the spread preventing portion can prevent the bonding material from spreading over the bonding surfaces in the direction along the bonding surfaces (in the direction along the planes) when the first sealing member and the second sealing member are directly bonded together so as to hermetically seal the driving electrodes of the piezoelectric resonator plate. Specifically, according to the present invention, when the first sealing member and the second sealing member are bonded together with a bonding material via the piezoelectric resonator plate, the bonding material can be prevented from spreading over the bonding surfaces (both of the major surfaces) of the piezoelectric resonator plate and the bonding surfaces of the first sealing member and the second sealing member in the direction along the bonding surfaces (in the direction along the planes).

The phenomenon of such spreading of the bonding material (wetting) in the bonding area is a natural result of heat/melt bonding with the bonding material; however, according to the present invention, even if the bonding material spreads over the bonding area, it is possible to prevent the bonding material from being squeezed out of the end face of the piezoelectric resonator device and to prevent the bonding material from entering the internal space of the piezoelectric resonator device. Moreover, the present invention enables the bonding material to be bonded to a plurality of surfaces of different surface orientations, bringing about an anchor effect and thereby improving the bonding strength.

In the method, a bonding region of the fifth bonding material on the bonding surface of the first sealing member and a bonding region of the sixth bonding material on the bonding surface of the second sealing member may have the same width.

In this case, since the bonding region of the fifth bonding material on the bonding surface of the first sealing member and the bonding region of the sixth bonding material on the bonding surface of the second sealing member have the same width, even if any misalignment in the bonding positions occurs during bonding of the piezoelectric resonator plate, the first sealing member, and the second sealing member, a self-alignment effect can be produced. In other words, it is possible to eliminate misalignment in the bonding positions.

Effects of the Invention

With the piezoelectric resonator device and the method for manufacturing such a piezoelectric resonator device according to the present invention, it is possible to prevent the bonding material from spreading over the bonding surfaces in the direction along the bonding surfaces (in the direction along the planes) when the first sealing member and the second sealing member are indirectly bonded together so as to hermetically seal the driving electrodes of the piezoelectric resonator plate.

DESCRIPTION OF REFERENCE NUMERALS

Figure 1:
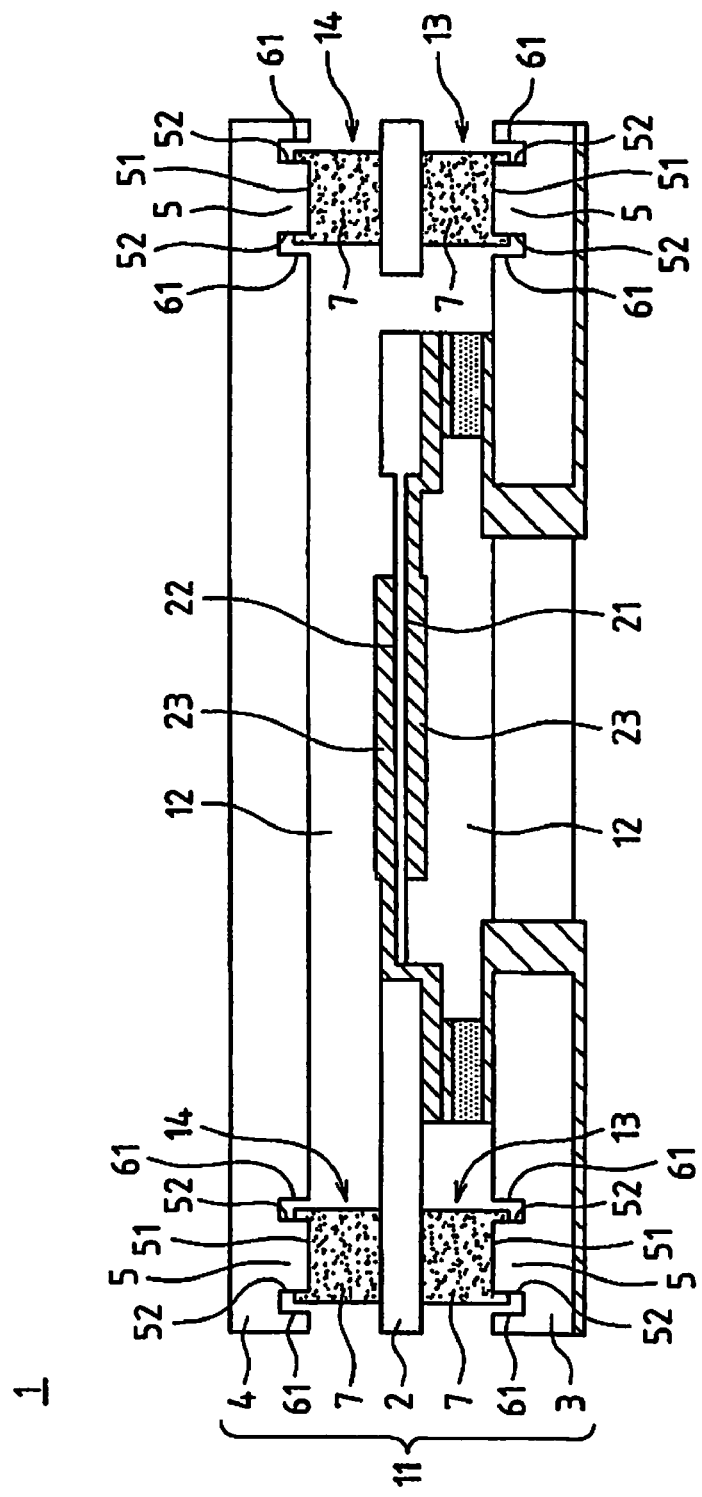
FIG. 1 is a schematic side view showing an internal space of a crystal resonator according to an embodiment of the present invention.

1 Crystal resonator
12 Internal space
13 Bonding area between crystal resonator plate and first sealing member
14 Bonding area between crystal resonator plate and second sealing member
15 Bonding area between first sealing member and second sealing member
2 Crystal resonator plate
21 One major surface of crystal resonator plate
22 Other major surface of crystal resonator plate
23 Driving electrode
25 Bonding surface of crystal resonator plate
3 First sealing member
32 Bonding surface of first sealing member
4 Second sealing member
42 Bonding surface of second sealing member
5 Protruding portion
51 End face of protruding portion
52 Both side faces of protruding portion
61 Recessed portion
62 Protruding wall portion
7 Bonding material
71 First bonding material
72 Second bonding material
73 Third bonding material
74 Fourth bonding material
75 Fifth bonding material
76 Sixth bonding material

MODE FOR CARRYING OUT THE INVENTION

Embodiments of the present invention are described below with reference to the drawings. Note that the embodiments described below concern the cases where the present invention is applied to a crystal resonator that is a piezoelectric resonator device generating piezoelectric resonance.

A crystal resonator 1 according to the present embodiment, as illustrated in FIG. 1, includes a crystal resonator plate 2 (a piezoelectric resonator plate according to the present invention), a first sealing member 3 that hermetically seals a driving electrode 23 formed on one major surface 21 of the crystal resonator plate 2 (see below), and a second sealing member 4 that hermetically seals a driving electrode 23 formed on the other major surface 22 of the crystal resonator plate 2 (see below).

In this crystal resonator 1, a package 11 is configured by bonding the crystal resonator plate 2 and the first sealing member 3 together with a bonding material 7 and by bonding the crystal resonator plate 2 and the second sealing member 4 together with another bonding material 7. With the first sealing member 3 and the second sealing member 4 bonded together via the crystal resonator plate 2, the package 11 contains two internal spaces 12, and the driving electrodes 23 formed on both of the major surfaces 21 and 22 of the crystal resonator plate 2 are hermetically sealed respectively in those internal spaces 12 of the package 11.

In the crystal resonator 1, a multiple-surface bonding portion that allows a bonding material 7 to be bonded to multiple surfaces of different surface orientations is further provided in a bonding area 13 between the crystal resonator plate 2 and the first sealing member 3 and in a bonding area 14 between the crystal resonator plate 2 and the second sealing member 4. Furthermore, a spread preventing portion that prevents a bonding region that is bonded to the bonding material 7 from being enlarged is provided on an outer side of the multiple-surface bonding portion (on the outer side in the direction along the bonding surfaces).

The multiple-surface bonding portion according to the present embodiment is a protruding portion 5 having multiple surfaces, and the bonding material 7 is bonded to the multiple surfaces including an end face 51 of the protruding portion 5 (specifically, the end face 51 and both side faces 52). The spread preventing portion according to the present embodiment is a recessed portion 61 formed on the outer side of the protruding portion 5 (on the outer side in the direction along the bonding surfaces).

Components of the above-described crystal resonator 1 are described next with reference to FIG. 2. Note that the description herein is given for each member, namely the crystal resonator plate 2, the first sealing member 3, and the second sealing member 4, which are not bonded together and each of which is configured as an independent component.

The crystal resonator plate 2 is made of quartz or a piezoelectric material and both of its major surfaces 21 and 22 are formed in an inverted-mesa shape. Then, the driving electrodes 23 are formed on thin-walled portions of both of the major surfaces 21 and 22 of an inverted-mesa shape, and lead electrodes 24 lead from those driving electrodes 23. Note that the lead electrodes 24 are electrically connected to electrode pads 33 formed on the first sealing member 3.

Both of the major surfaces 21 and 22 of the crystal resonator plate 2 (bonding surfaces 25 bonded to the first sealing member 3 and the second sealing member 4) are formed into flat smooth surfaces (by mirror finishing).

In the crystal resonator plate 2, the bonding surfaces 25 bonded to the first sealing member 3 and the second sealing member 4 are peripheral end portions 26 of both of the major surfaces 21 and 22, as viewed in plane, whereas central portions of both of the major surfaces 21 and 22 form a resonance region 27. The resonance region 27 is connected to the bonding surfaces 25 via a portion 28 (in the vicinity of one side portion in a longitudinal direction).

The bonding surface 25 of one major surface 21 of the crystal resonator plate 2 has formed thereon a first bonding material 71 for bonding the first sealing member 3. The bonding surface 25 of the other major surface 22 of the crystal resonator plate 2 has a second bonding material 72 for bonding the second sealing member 4.

The first bonding material 71 and the second bonding material 72 have the same configuration. The first bonding material 71 and the second bonding material 72 are configured by laminating multiple layers on the bonding surfaces 25 of the peripheral end portions 26 of both of the major surfaces 21 and 22, as viewed in plane; when viewed from the bottom layer side, forming a Cr layer (not shown) and an Au layer (not shown) by evaporation and laminating thereon Au-plated layers 711 and 721.

Figure 2:
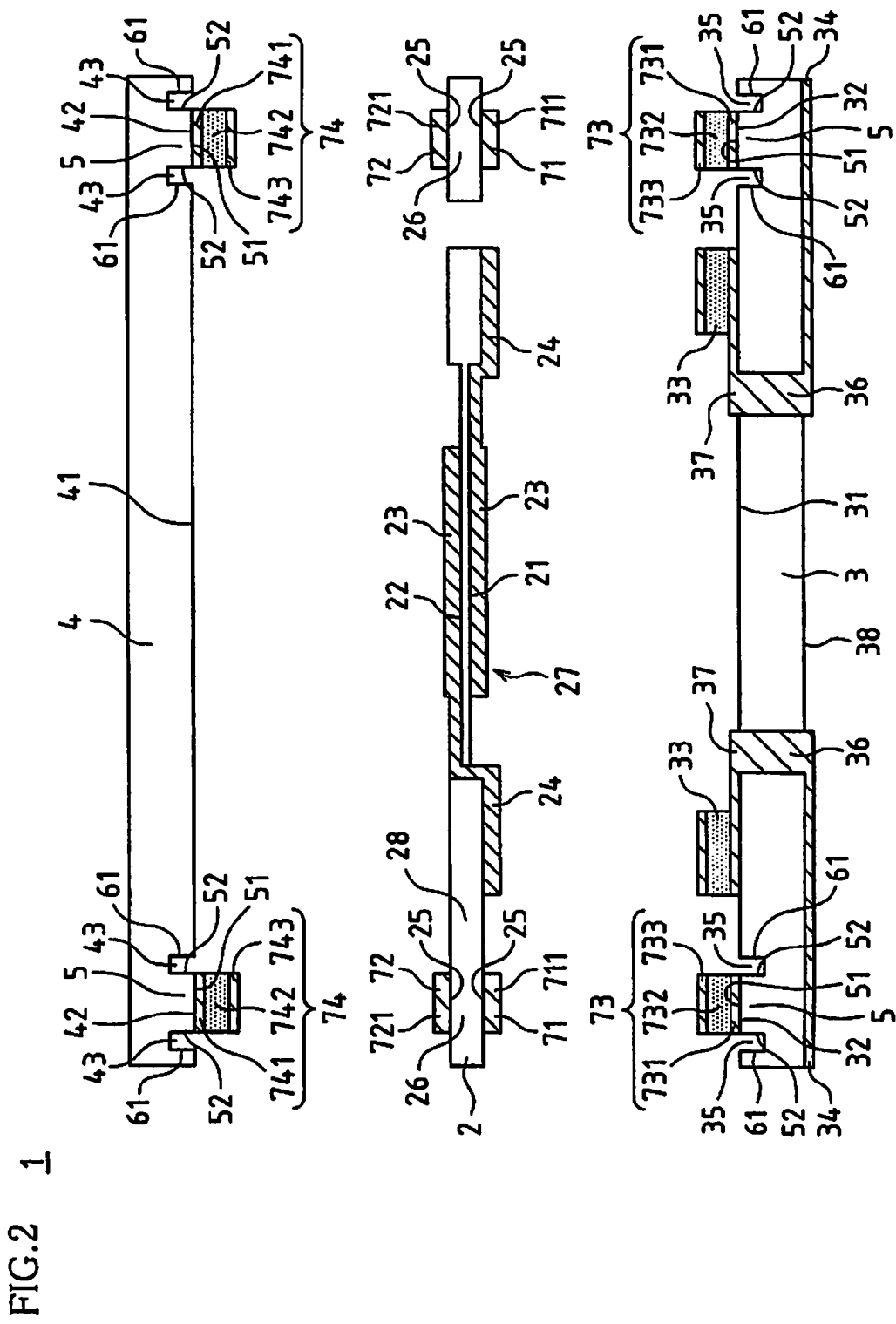
FIG. 2 is a schematic structural diagram illustrating components of the crystal resonator according to the embodiment of the present invention.

The first sealing member 3, as illustrated in FIG. 2, is a substrate of a rectangular parallelepiped shape formed from a single glass wafer, with its one major surface 31 (a below-described bonding surface 32 bonded to the crystal resonator plate 2) formed into a flat smooth surface (by mirror finishing).

The first sealing member 3 includes electrode pads 33 that are electrically connected to the driving electrodes 23 of the crystal resonator plate 2, a bonding portion that is bonded to the crystal resonator plate 2 (specifically, the bonding surface 32), and an external electrode terminal 34 that is electrically connected to the outside. The bonding surface 32 bonded to the crystal resonator plate 2 is provided on the outer periphery of one major surface 31 of the first sealing member 3 as viewed in plane.

The bonding surface 32 has formed thereon a multiple-surface bonding portion that allows a bonding material 7 to be bonded to multiple surfaces of different surface orientations and a spread preventing portion that prevents a bonding region bonded to the bonding material 7 from being enlarged.

The multiple-surface bonding portion and the spread preventing portion are configured by forming two grooves 35 side by side along the outer periphery of one major surface 31 of the first sealing member 3. Specifically, the formation of the two grooves 35 produces the protruding portion 5 therebetween, which forms the multiple-surface bonding portion, and the recessed portions 61 that are formed continuous to the protruding portion 5 on the outer side of the protruding portion 5 (on the outer side in the direction along the bonding surfaces) form the spread preventing portion.

The bonding surface 32 of the first sealing member 3 has formed thereon a third bonding material 73 for bonding the crystal resonator plate 2. Specifically, the third bonding material 73 is configured by laminating multiple layers on the end face 51 of the protruding portion 5; when viewed from the bottom layer side, forming a Cr layer (not shown) and an Au layer 731 by evaporation, laminating thereon an Au—Sn alloy layer 732, and then laminating thereon an Au flash plated layer 733. Alternatively, the third bonding material 73 may be configured by forming a Cr layer and an Au layer by evaporation from the bottom surface side and then laminating thereon a Sn-plated layer and an Au-plated layer in this order. Note that the third bonding material 73 and the electrode pads 33 are formed at the same time so that the electrode pads 33 have the same configuration as the third bonding material 73.

The first sealing member 3 has, as illustrated in FIG. 2, a through hole 36 formed therein so as to provide continuity between the driving electrodes 23 of the crystal resonator plate 2 and the outside. Through such the through hole 36, an electrode pattern 37 is formed from the electrode pads 33 on one major surface 31 of the first sealing member 3 to the external electrode terminal 34 on the other major surface 38.

The second sealing member 4, as illustrated in FIG. 2, is a substrate of a rectangular parallelepiped shape formed from a single glass wafer, with its one major surface 41 (a below-described bonding surface 42 bonded to the crystal resonator plate 2) formed into a flat smooth surface (by mirror finishing).

This second sealing member 4 has a bonding portion (specifically, the bonding surface 42) that is bonded to the crystal resonator plate 2. The bonding surface 42 is provided on the outer periphery of the major surface 41 of the second sealing member 4 as viewed in plane.

Moreover, the bonding surface 42 has formed thereon a multiple-surface bonding portion that allows a bonding material 7 to be bonded to multiple surfaces of different surface orientations and a spread preventing portion that prevents a bonding region bonded to the bonding material 7 from being enlarged.

The multiple-surface bonding portion and the spread preventing portion are configured by forming two grooves 43 side by side along the outer periphery of one major surface 41 of the second sealing member 4. Specifically, the formation of the two grooves 43 produces a protruding portion 5 therebetween, which forms the multiple-surface bonding portion, and recessed portions 61 formed continuous to the protruding portion 5 on the outer side of the protruding portion 5 (on the outer side in the direction along the bonding surfaces) form the spread preventing portion.

The bonding surface 42 of the second sealing member 4 has formed thereon a fourth bonding material 74 for bonding the crystal resonator plate 2. Specifically, the fourth bonding material 74 is configured by laminating multiple layers on an end face 51 of the protruding portion 5; when viewed from the bottom layer side, forming a Cr layer (not shown) and an Au layer 741 by evaporation, laminating thereon an Au—Sn alloy layer 742, and then laminating thereon an Au flash plated layer 743. Alternatively, the fourth bonding material 74 may be configured by forming a Cr layer and an Au layer by evaporation from the bottom surface side and then laminating thereon an Sn-plated layer and an Au-plated layer in this order.

Note that the above-described bonding region (specifically, a sealed path) of the first bonding material 71 on the bonding surface 25 of the crystal resonator plate 2 and the above-described bonding region (specifically, a sealed path) of the third bonding material 73 on the bonding surface 32 of the first sealing member 3 have the same width. It is also noted that the bonding region (specifically, a sealed path) of the second bonding material 72 on the bonding surface 25 of the crystal resonator plate 2 and the bonding region (specifically, a sealed path) of the fourth bonding material 74 on the bonding surface 42 of the second sealing member 4 have the same width.

A method for manufacturing this crystal resonator 1 is described next with reference to FIGS. 1 and 2. Note that the present embodiment describes the manufacturing method in which a crystal resonator plate 2 as an individual piece is arranged on each of multiple first sealing members 3 formed on a wafer, and then a second sealing member 4 as an individual piece is further arranged thereon. The present invention is, however, not limited to the method described in the present embodiment; the present invention may, for example, be applied to such a method in which a crystal wafer with multiple crystal resonator plates 2 formed thereon is provided on a glass wafer with multiple first sealing members 3 formed thereon, then a glass wafer with multiple second sealing members 4 formed thereon is further provided thereon, and thereafter, the crystal resonator plates 2, the first sealing members 3, and the second sealing members 4 are bonded together and split into individual pieces. Such a method is suitable for the mass production of crystal resonators 1.

On one major surface 31 of each of multiple first sealing members 3 formed on a glass wafer (not shown) with the above-described configuration, a crystal resonator plate 2 as an individual piece is arranged in a position that has been set by an image recognition portion so that one major surface 21 of the crystal resonator plate 2 and one major surface 31 of the first sealing member 3 face each other.

After the crystal resonator plate 2 has been arranged on the first sealing members 3, a second sealing member 4 as an individual piece is arranged on the other major surface 22 of the crystal resonator plate 2 in a position that has been set by the image recognition portion so that one major surface 41 of the second sealing member 4 and the other major surface 22 of the crystal resonator plate 2 face each other, and then the crystal resonator plate 2, the first sealing members 3, and the second sealing member 4 are laminated one above another.

After the lamination of the crystal resonator plate 2, the first sealing member 3, and the second sealing member 4, the crystal resonator plate 2, the first sealing members 3, and the second sealing member 4 are temporarily bonded by ultrasound, using the FCB method.

After the temporary bonding of the crystal resonator plate 2, the first sealing member 3, and the second sealing member 4, other manufacturing steps (such as draining a gas from the internal space 12 and controlling oscillation frequencies) are performed and heat/melt bonding is performed thereafter. Note that the manufacturing steps according to the present embodiment are performed in a vacuum atmosphere.

Note that the heat/melt bonding causes the first bonding material 71 and the third bonding material 73 to be bonded together, forming a bonding member 7, with which the crystal resonator plate 2 and the first sealing member 3 are bonded together. The bonding of the crystal resonator plate 2 and the first sealing member 3 with the bonding material 7 hermetically seals the driving electrode 23 formed in the resonance region of one major surface 21 of the crystal resonator plate 2, as illustrated in FIG. 1.

Simultaneously with the bonding of the first bonding material 71 and the third bonding material 73, the heat/melt bonding causes the second bonding material 72 and the fourth bonding material 74 to be bonded together, forming a bonding material 7, with which the crystal resonator plate 2 and the second sealing member 4 are bonded together. The bonding of the crystal resonator plate 2 and the second sealing member 4 with the bonding material 7 hermetically seals the driving electrode 23 formed in the resonance region of the other major surface 22 of the crystal resonator plate 2, as illustrated in FIG. 1.

As described above, with the crystal resonator 1 and its manufacturing method according to the present embodiment, it is possible to prevent the bonding materials 7 from spreading over the bonding surfaces in the direction along the bonding surfaces (in the direction along the planes) in the case where the first sealing member 3 and the second sealing member 4 are indirectly bonded together so as to hermetically seal the driving electrodes 23 of the crystal resonator plate 2.

Specifically, with the crystal resonator 1 according to the present embodiment, the provision of the multiple-surface bonding portion and the spread preventing portion can prevent the bonding materials 7 from spreading over the bonding surfaces 25 of the crystal resonator plate 2 (both of the major surfaces 21 and 22) and the bonding surfaces 32 and 42 (one major surfaces 31 and 41) of the first sealing member 3 and the second sealing member 4 in the direction along the major surfaces (in the direction along the planes) in the case where the first sealing member 3 and the second sealing member 4 are bonded together with the bonding materials 7 via the crystal resonator plate 2. The phenomenon of the spreading of the bonding materials 7 (wetting) in the bonding areas 13 and 14 is a natural result of the heat-melt bonding with the bonding materials 7 (specifically, the first bonding material 71, the second bonding material 72, the third bonding material 73, and the fourth bonding material 74); however, even if the bonding materials 7 spread in the bonding areas 13 and 14, it is possible according to the present embodiment to prevent the bonding materials 7 from being squeezed out of the end face of the crystal resonator 1 and to prevent the bonding materials 7 from entering the internal space 12 of the crystal resonator 1.

Moreover, with the crystal resonator 1 according to the present embodiment, the provision of the multiple-surface bonding portion and the spread preventing portion allows the bonding materials 7 to be bonded to multiple surfaces of different surface orientations (specifically, the end face 51 and both side faces 52 of the protruding portions 5), causing an anchor effect and thereby improving the bonding strength.

Also, the bonding materials 7 can bond to multiple surfaces of different surface orientations in all the bonding areas, including the bonding area 13 between the crystal resonator plate 2 and the first sealing member 3 and the bonding area 14 between the crystal resonator plate 2 and the second sealing member 4; such a configuration is suitable for causing an anchor effect and improving the bonding strength.

Still also, because a bonding region (specifically, a sealed path) of the first bonding material 71 on the bonding surface 25 of the crystal resonator plate 2 and a bonding region (specifically, a sealed path) of the third bonding material 73 on the bonding surface 32 of the first sealing member 3 have the same width and because a bonding region (specifically, a sealed path) of the second bonding material 72 on the bonding surface 25 of the crystal resonator plate 2 and a bonding region (specifically, a sealed path) of the fourth bonding material 74 on the bonding surface 42 of the second sealing member 4 have the same width, even if misalignment in the bonding positions occurs during bonding of the crystal resonator plate 2, the first sealing member 3, and the second sealing member 4, a self-alignment effect can be produced. In other words, it is possible to eliminate misalignment in the bonding positions.

Moreover, because the multiple-surface bonding portion are protruding portions 5 with multiple surfaces and the bonding materials 7 bond to multiple surfaces including the end faces 51 of such protruding portions 5, the bonding materials 7 can bond to continuous multiple surfaces of different surface orientations, which is more likely to bring about an anchor effect.

Moreover, because the spread preventing portion are recessed portions 61 formed on the outer side of the multiple-surface bonding portion (on the outer side in the direction along the bonding surfaces), even if the bonding materials 7 spread over in the bonding areas 13 and 14 after bonding, it is possible according to the present embodiment to prevent the bonding materials 7 from flowing to (wetting) the end face of the crystal resonator 1 and to prevent the bonding materials 7 from entering the internal space 12 of the crystal resonator 1.

Moreover, although the bonding materials 7 are likely to flow to (or wet) the bonding areas 13 and 14 because the bonding surfaces 25 of the crystal resonator plate 2, the bonding surface 32 of the first sealing member 3, and the bonding surface 42 of the second sealing member 4 in the bonding areas 13 and 14 are smooth surfaces, even in such as case, it is possible to prevent the bonding materials 7 from flowing to (wetting) the end face of the crystal resonator 1 and to prevent the bonding materials 7 from entering the internal space 12 of the crystal resonator 1.

Figure 3:
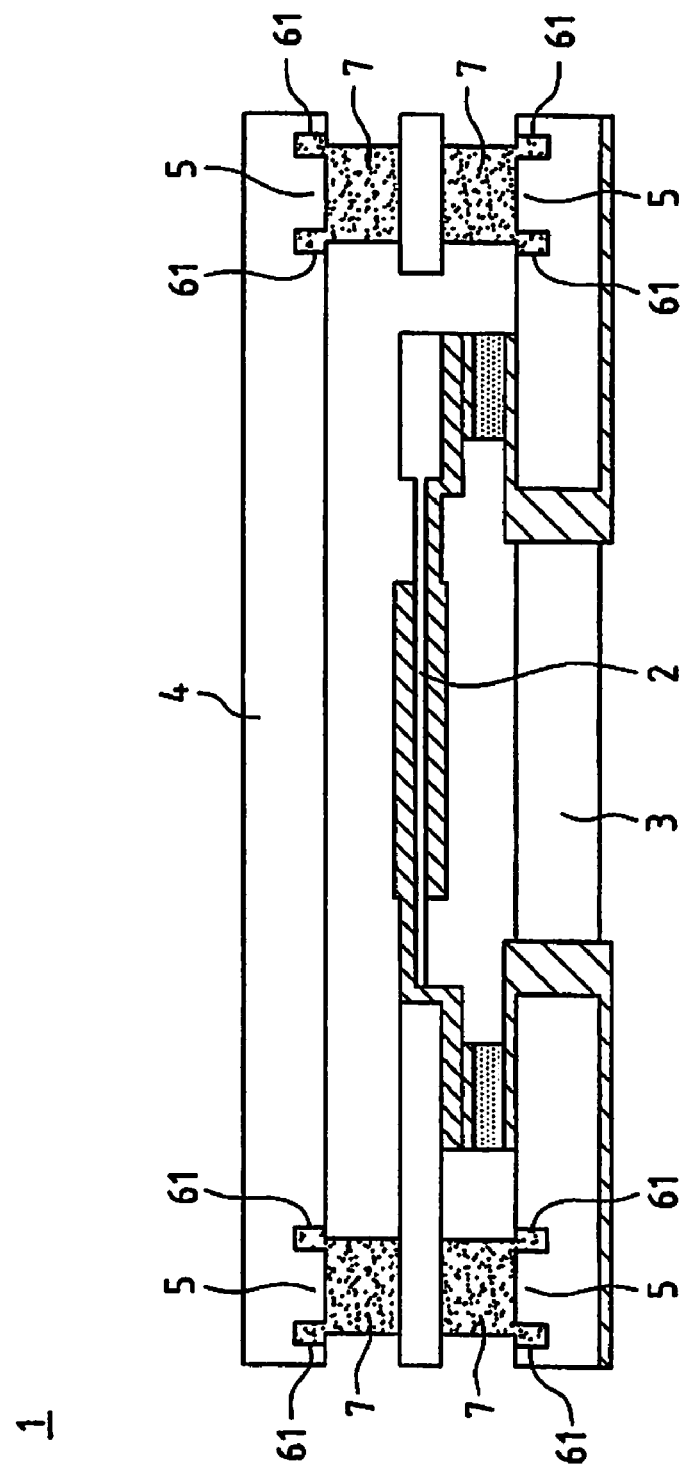
FIG. 3 is a schematic side view showing an internal space of a crystal resonator according to another embodiment of the present invention.

While, in the above-described present embodiment, the bonding of the crystal resonator plate 2, the first sealing member 3, and the second sealing member 4 causes the bonding materials 7 to be heated and melt and to thereby be bonded to only the protruding portions 5 as illustrated in FIG. 1, if the amount of the bonding materials 7 is changed by, for example, being increased to more than the amount used in the present embodiment, the recessed portions 61 will be filled in as illustrated in FIG. 3. In this case, an anchor effect can also be produced in those recessed portions 61, which further improves the bonding strength.

Note that, in the present embodiment, while the crystal resonator plate 2, the first sealing member 3, and the second sealing member 4 are bonded together in a vacuum atmosphere, the present invention is not limited thereto, and an inert gas such as a nitrogen gas may be used for bonding.

Also, in the present embodiment, while Cr, Au, and Sn are used as the bonding materials 7, the present invention is not limited thereto; the bonding materials 7 may, for example, be configured from Cr, Au, and Ge.

Also, in the present embodiment, while the multiple-surface bonding portion and the spread preventing portion are provided in both the bonding area 13 between the crystal resonator plate 2 and the first sealing member 3 and the bonding area 14 between the crystal resonator plate 2 and the second sealing member 4, this is only one suitable example of the present invention and is not intended to limit the present invention. The effect of the present invention can be achieved as long as the multiple-surface bonding portion and the spread preventing portion are provided in at least either of the bonding area 13 between the crystal resonator plate 2 and the first sealing member 3 and the bonding area 14 between the crystal resonator plate 2 and the second sealing member 4.

Also, in the present embodiment, while the spread preventing portion are recessed portions 61 that are formed continuous to a protruding portion 5 or multiple-surface bonding portion on the outer side of the protruding portion 5 (on the outer side in the direction along the bonding surfaces), this is only one example of an embodiment and the present invention is not limited thereto. The effect of the present invention can be achieved as long as the spread preventing portion is provided on the outer side of the multiple-surface bonding portion (on the outer side in the direction along the bonding surfaces).

Figure 4:
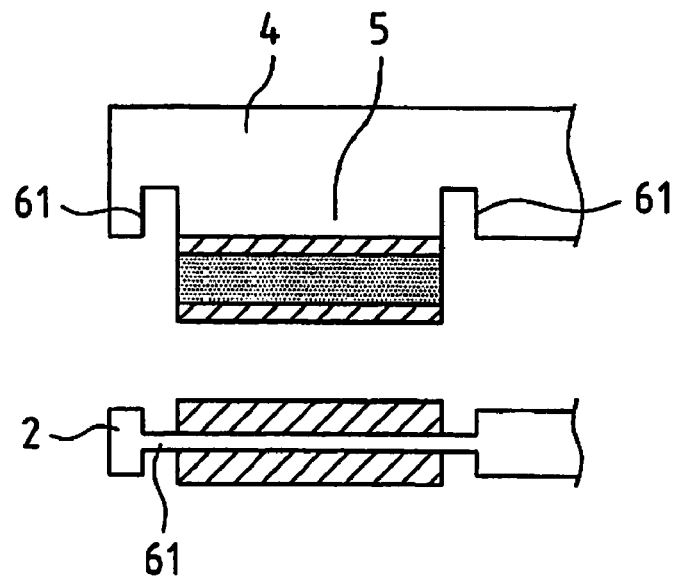
FIG. 4 is a schematic side view illustrating an enlarged bonding structure between a crystal resonator plate and a second sealing member according to another embodiment of the present invention.
Figure 5:
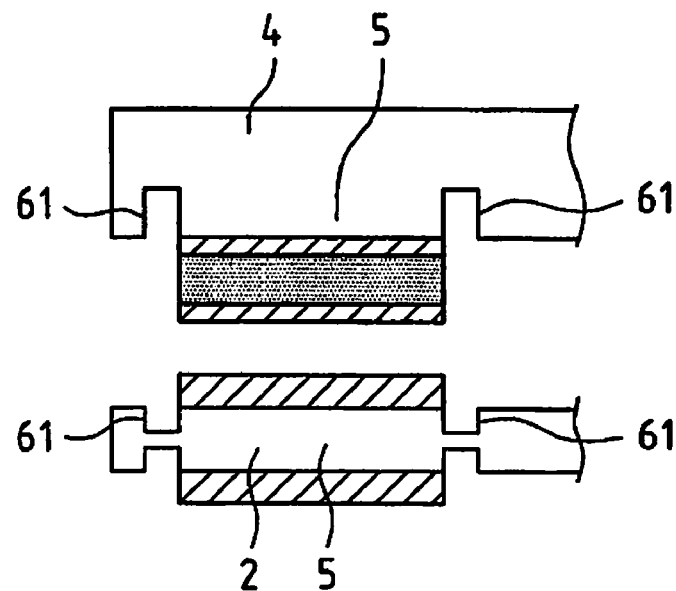
FIG. 5 is a schematic side view illustrating an enlarged bonding structure between a crystal resonator plate and a second sealing member according to another embodiment of the present invention.

Also, in the present embodiment, while both the first sealing member 3 and the second sealing member 4 are provided with the multiple-surface bonding portion and the spread preventing portion, the present invention is not limited thereto; for example, as illustrated in FIG. 4, the second sealing member 4 (and the first sealing member 3) may be provided with the multiple-surface bonding portion (protruding portion 5) and the spread preventing portion (recessed portions 61), and the crystal resonator plate 2 may be provided with the spread preventing portion (recessed portions 61). As another alternative, all the devices, including the crystal resonator plate 2, the first sealing member 3, and the second sealing member 4, may be provided with the multiple-surface bonding portion and the spread preventing portion as illustrated in FIG. 5.

Figure 6:
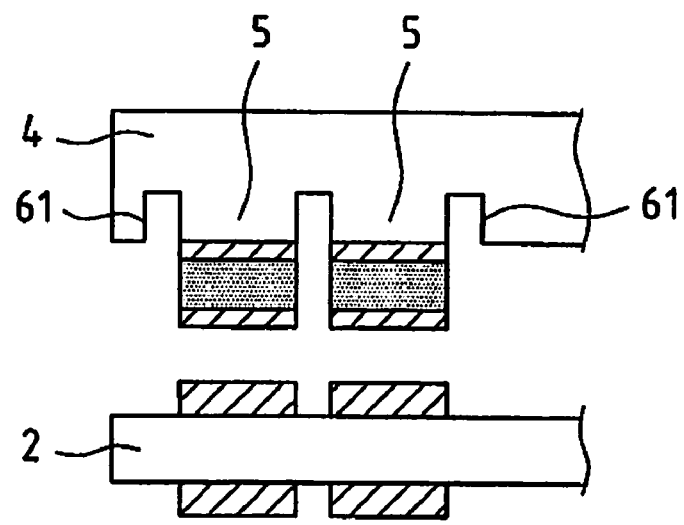
FIG. 6 is a schematic side view illustrating an enlarged bonding structure between a crystal resonator plate and a second sealing member according to another embodiment of the present invention.
Figure 7:
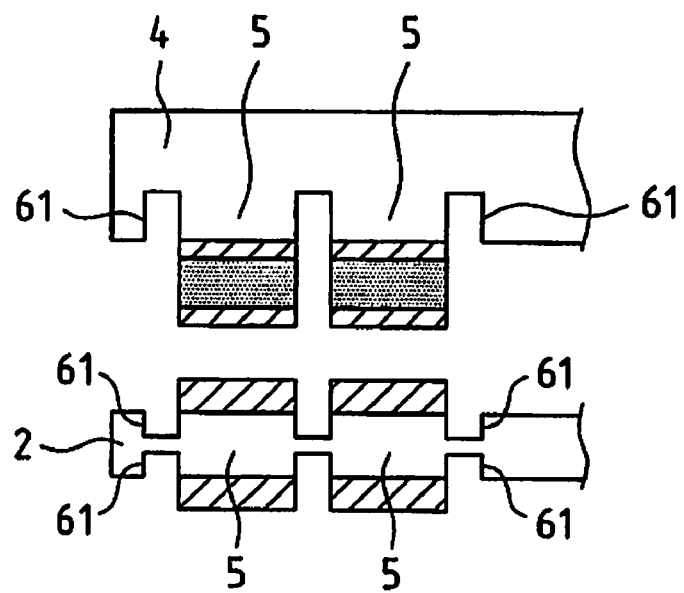
FIG. 7 is a schematic side view illustrating an enlarged bonding structure between a crystal resonator plate and a second sealing member according to another embodiment of the present invention.

Also, in the present embodiment, while both the first sealing member 3 and the second sealing member 4 are provided with a single multiple-surface bonding portion and two spread preventing portion, the numbers of multiple-surface bonding portion and spread preventing portion are not limited thereto, and any arbitrary number of the multiple-surface bonding portion and the spread preventing portion may be provided. Specifically, as illustrated in FIG. 6, the second sealing member 4 (and the first sealing member 3) may include two multiple-surface bonding portion (protruding portions 5) and two spread preventing portion (recessed portions 61); or as another alternative, as illustrated in FIG. 7, the second sealing member 4 (and the first sealing member 3) may include two multiple-surface bonding portion (protruding portions 5) and two spread preventing portion (recessed portions 61), whereas the crystal resonator plate 2 may include a total of four multiple-surface bonding portion (protruding portions 5) and four spread preventing portion (recessed portions 61) on both its major surfaces 21 and 22.

Figure 8:
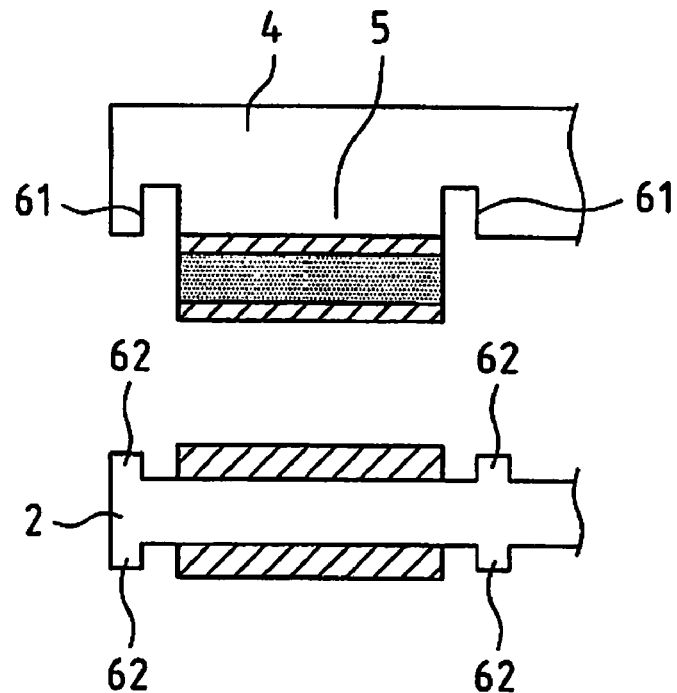
FIG. 8 is a schematic side view illustrating an enlarged bonding structure between a crystal resonator plate and a second sealing member according to another embodiment of the present invention.

Also, in the present embodiment, while the spread preventing portion is a recessed portion 61, the present invention is not limited thereto; the spread preventing portion may, for example, be a protruding wall portion 62 that is formed on the outer side of the multiple-surface bonding portion (on the outer side in the direction along the bonding surfaces) as illustrated in FIG. 8, as long as it can prevent the bonding materials 7 from spreading over both of the major surfaces 21 and 22 of the crystal resonator plate 2 in the direction along the major surfaces (in the direction along the planes).

In this case, since the spread preventing portion is a protruding wall portion 62 that is formed on the outer side of the multiple-surface bonding portion (on the outer side of the protruding portion 5 of the second sealing member 4 that has been bonded to the crystal resonator plate 2, as illustrated in FIG. 8), it is possible according to the present embodiment to prevent the bonding materials 7 from flowing to (wetting) the end face of the crystal resonator 1 and to prevent the bonding materials 7 from entering the internal space 12 of the crystal resonator 1, even if the bonding materials 7 spread over the bonding areas 13 and 14 after bonding.

In other words, as is evident from the fact that the concrete examples of the spread preventing portion are the above-described recessed portions 61 illustrated in FIGS. 1 to 7 or the protruding wall portion 62 illustrated in FIG. 8, the spread preventing portion may preferably be configured projecting and/or recessed in the direction at a right angle to the direction along the major surfaces (or in the approximately vertical direction).

Figure 9:
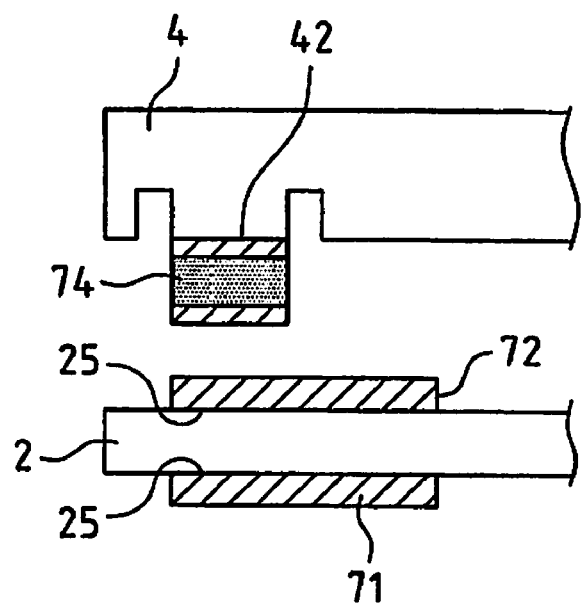
FIG. 9 is a schematic side view illustrating an enlarged bonding structure between a crystal resonator plate and a second sealing member according to another embodiment of the present invention.

Also, in the present embodiment, while the bonding region (specifically, a sealed path) of the first bonding material 71 on the bonding surface 25 of the crystal resonator plate 2 and the bonding region (specifically, a sealed path) of the third bonding material 73 on the bonding surface 32 of the first sealing member 3 have the same width and the bonding region (specifically, a sealed path) of the second bonding material 72 on the bonding surface 25 of the crystal resonator plate 2 and the bonding region (specifically, a sealed path) of the fourth bonding material 74 on the bonding surface 42 of the second sealing member 4 have the same width, the present invention is not limited thereto. For example, as illustrated in FIG. 9, the bonding region (specifically, a sealed path) of the first bonding material 71 on the bonding surface 25 of the crystal resonator plate 2 may have a greater width than the bonding region (specifically, a sealed path) of the third bonding material 73 on the bonding surface 32 of the first sealing member 3 and the bonding region (specifically, a sealed path) of the second bonding material 72 on the bonding surface 25 of the crystal resonator plate 2 may have a greater width than the bonding region (specifically, a sealed path) of the fourth bonding material 74 on the bonding surface 42 of the second sealing member 4.

Since, in this case, the bonding regions of the first bonding material 71 and the second bonding material 72 on the bonding surface 25 of the crystal resonator plate 2 have greater widths than the bonding region of the third bonding material 73 on the bonding surface 32 of the first sealing member 3 and the bonding region of the fourth bonding material 74 on the bonding surface 42 of the second sealing member 4, the third bonding material 73 and the fourth bonding material 74 are drawn to the wider bonding regions of the first bonding material 71 and the second bonding material 72, in the case where the crystal resonator plate 2, the first sealing member 3, and the second sealing member 4 are bonded together. This phenomenon is caused by the use of Sn for the third bonding material 73 and the fourth bonding material 74, with Sn drawn by Au of the first bonding material 71 and the second bonding material 72; it is thus possible by making use of this phenomenon to prevent the bonding materials 7 from being squeezed out of the end face of the crystal resonator 1.

Also, while the present embodiment describes a configuration in which the crystal resonator plate 2 and the first sealing member 3 are bonded together with the bonding material 7, and the crystal resonator plate 2 and the second sealing member 4 are bonded together with the bonding material 7, the present invention is not limited thereto. Alternatively, as illustrated in FIGS. 10 and 11, the crystal resonator plate 2 may be mounted on a packaged first sealing member 3, and this first sealing member 3 may be bonded to a second sealing member with a bonding material 7 so as to hermetically seal the driving electrodes 23 of the crystal resonator 1.

Figure 10:
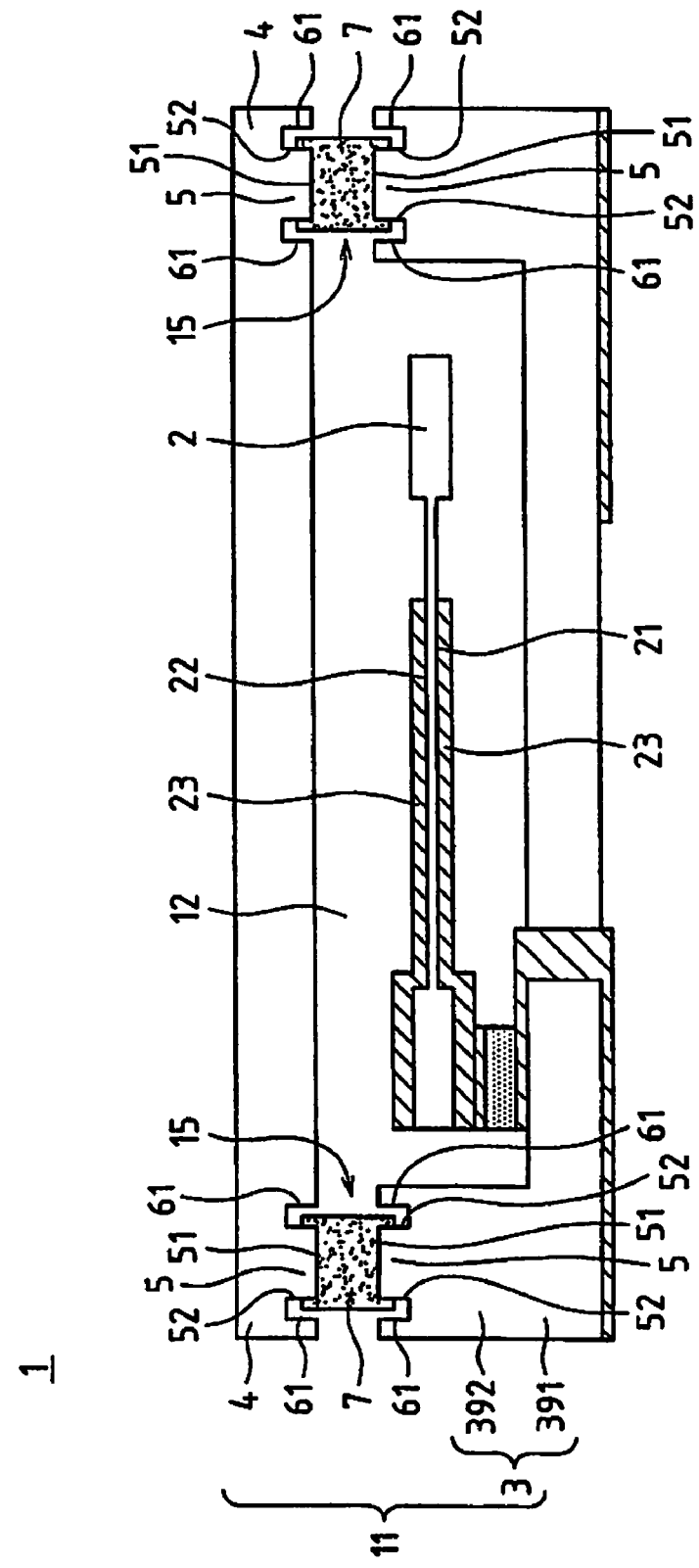
FIG. 10 is a schematic side view showing an internal space of a crystal resonator according to another embodiment of the present invention.
Figure 11:
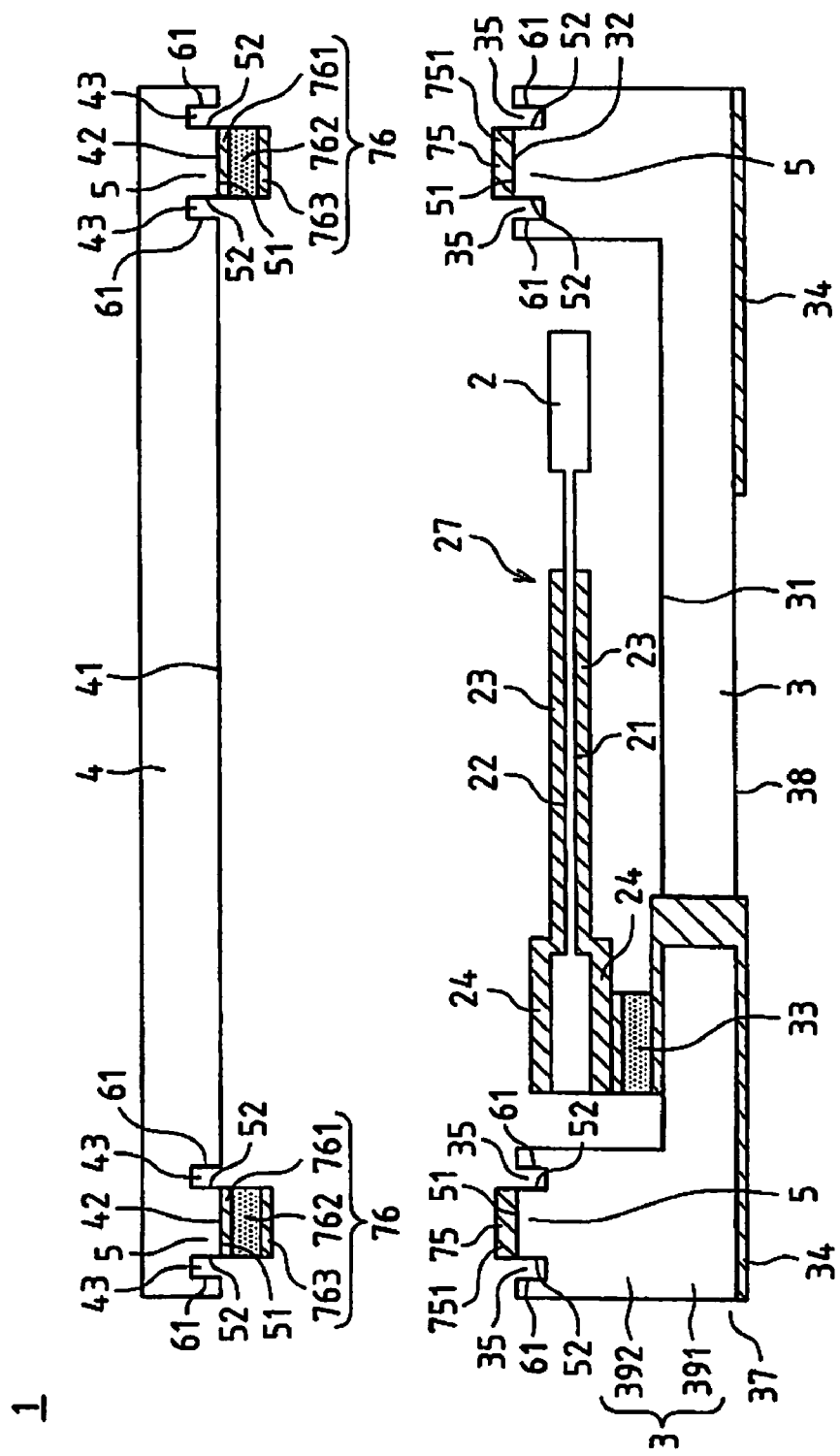
FIG. 11 is schematic structural diagram illustrating components of a crystal resonator according to another embodiment of the present invention.

Specifically, the crystal resonator 1 illustrated in FIGS. 10 and 11 is made of a piezoelectric material and includes a crystal resonator plate 2 with driving electrodes 23 formed on both its major surfaces 21 and 22, a first sealing member 3 equipped with the crystal resonator plate 2, and a second sealing member 4 that is bonded to the first sealing member 3 with a bonding material 7 so as to hermetically seal the driving electrodes 23 of the crystal resonator plate 2.

The first sealing member 3 is, as illustrated in FIGS. 10 and 11, a glass base of a box-like body shape that has a bottom face 391 and a bank portion 392 extending upward from the bottom face 391. A top surface of the bank portion 392 of this first sealing member 3 forms a bonding surface 32, which is formed into a flat smooth surface (by mirror finishing). A fifth bonding material 75 for bonding the second sealing member 4 is formed on the bonding surface 32 of the first sealing member 3. Note that the fifth bonding material 75 is configured by laminating multiple layers on the bonding surface 32 of the bank portion 392; when viewed from the bottom layer side, forming a Cr layer (not shown) and an Au layer (not shown) by evaporation and then laminating thereon an Au-plated layer 751.

The second sealing member 4 is, as illustrated in FIGS. 10 and 11, a lid that consists of a substrate of a rectangular parallelepiped shape formed from a single glass wafer. One major surface 41 of this second sealing member 4 is the bonding surface 42, and this bonding surface 42 is formed into a flat smooth surface (by mirror finishing). The second sealing member 4 has a sixth bonding material 76 for bonding the first sealing member 3, formed on the periphery of one major surface 41 of the second sealing member 4 as viewed in plane. Note that the sixth bonding material 76 is configured by laminating multiple layers on the bonding surface 42; when viewed from the bottom layer side, forming a Cr layer (not shown) and an Au layer 761 by evaporation, laminating thereon an Au—Sn alloy layer 762, and then laminating thereon an Au flash plated layer 763. As another alternative, the sixth bonding material 76 may be configured by forming a Cr layer and an Au layer by evaporation from the bottom surface side and then laminating thereon an Sn-plated layer and an Au-plated layer in this order.

A multiple-surface bonding portion and a spread preventing portion are provided in a bonding area 15 between the first sealing member 3 and the second sealing member 4, the multiple-surface bonding portion allowing the bonding materials 7 to be bonded to multiple surfaces of different surface orientations, the spread preventing portion preventing a bonding region bonded to the bonding materials 7 from being enlarged toward the outer side of the multiple-surface bonding portion. Note that the multiple-surface bonding portion illustrated in FIGS. 10 and 11 is a protruding portion 5 with multiple surfaces, and the bonding material 7 is bonded to multiple surfaces including the end face 51 of the protruding portion 5 (specifically, the end face 51 and both side faces 52). The spread preventing portion is a recessed portion 61 formed on the outer side of the protruding portion 5.

In the crystal resonator 1 illustrated in FIG. 10, the bonding material 7 is configured by bonding the fifth bonding material 75 to the sixth bonding material 76. Since the first sealing member 3 and the second sealing member 4 of this crystal resonator 1 are bonded together with the bonding material 7, a single internal space 12 is formed in the package 11, and the driving electrodes 23 formed on both of the major surfaces 21 and 22 of the crystal resonator plate 2 are hermetically sealed in this internal space 12 of the package 11.

Because the crystal resonator 1 illustrated in FIG. 10, like the above-described crystal resonator 1 illustrated in FIGS. 1 to 9, is provided with the multiple-surface bonding portion and the spread preventing portion, it can produce a similar function and a similar effect to those of the above-described crystal resonator 1 illustrated in FIGS. 1 to 9, thus preventing the bonding materials 7 from spreading over the bonding surfaces in the direction along the bonding surfaces (in the direction along the planes) in the case where the first sealing member 3 and the second sealing member 4 are directly bonded together so as to hermetically seal the driving electrodes 23 of the crystal resonator plate 2.

While the above-described crystal resonators 1 illustrated in FIGS. 10, 11, and so on include the multiple-surface bonding portion that are protruding portions 5 and the spread preventing portion that are recessed portions 61, such multiple-surface bonding portion and spread preventing portion are not limited to those embodiments shown. For example, the multiple-surface bonding portion and the spread preventing portion may be such as those provided on the second sealing member 4 illustrated in FIG. 12.

Figure 12:
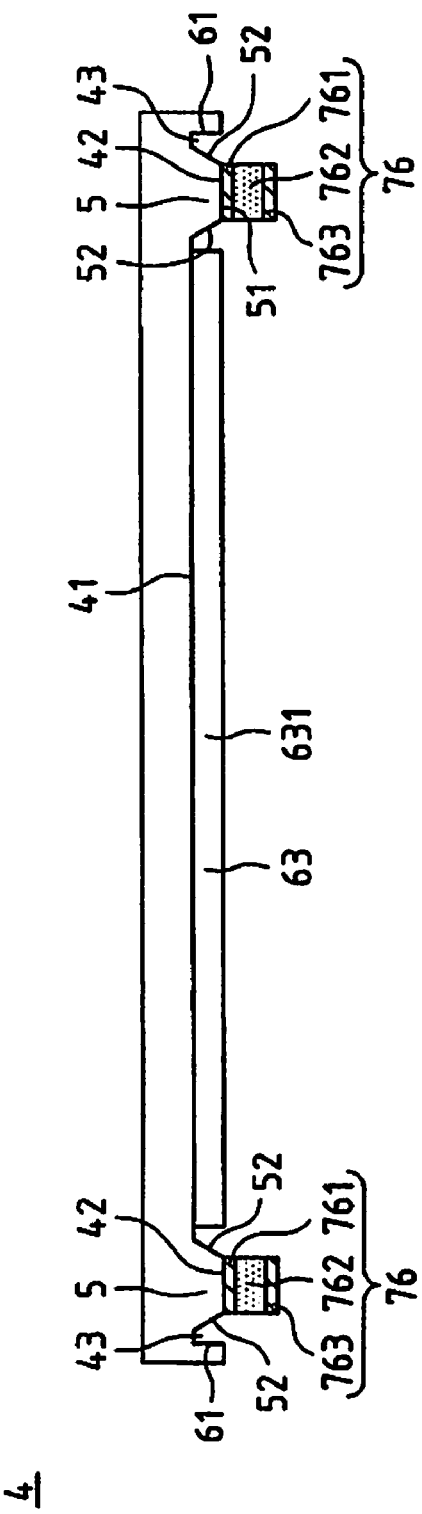
FIG. 12 is a schematic structural diagram of a second sealing member according to another embodiment of the present invention.

The second sealing member 4 illustrated in FIG. 12 is a lid that consists of a substrate of a rectangular parallelepiped shape formed from a single glass wafer. One major surface 41 of this second sealing member 4 forms the bonding surface 42, and this bonding surface 42 is formed into a flat smooth surface (by mirror finishing). The second sealing member 4 has a sixth bonding material 76 for bonding the first sealing member 3, formed on the outer periphery of its one major surface 41 as viewed in plane. Note that the sixth bonding material 76 is configured by laminating multiple layers on the bonding surface 42; when viewed from the bottom layer side, forming a Cr layer (not shown) and an Au layer 761 by evaporation, laminating thereon an Au—Sn alloy layer 762, and then laminating thereon an Au flash plated layer 763.

A multiple-surface bonding portion and a spread preventing portion are provided in the bonding area 15 of the second sealing member 4, the multiple-surface bonding portion allowing the bonding materials 7 to be bonded to multiple surfaces of different surface orientations, the spread preventing portion preventing a bonding region bonded to the bonding materials 7 from being enlarged toward the outer side of the multiple-surface bonding portion (on the outer side in the direction along the bonding surfaces). Note that the multiple-surface bonding portion illustrated in FIG. 12 is a protruding portion 5 with multiple surfaces, and both side faces 52 of such a protruding portion 5 are tapered. Meanwhile, the spread preventing portion includes a recessed portion 61 formed outside the protruding portion 5, and an Ni-plated portion 63 formed outside the protruding portion 5 (on the inner outside of the second sealing member 4) in a central region of one major surface 41 of the second sealing member 4 as viewed in plan. The Ni-plated portion 63 herein is a metal film that is configured by laminating multiple layers in the central region of one major surface 41 of the second sealing member 4 as viewed in plane; when viewed from the bottom layer side, forming a Cr layer (not shown) and an Au layer (not shown) by evaporation and laminating thereon an Ni-plated layer 631 that is either an Ni-plated layer or an Ni alloy-plated layer. Note that the thickness of the metal film herein is set to 1 to 10 μm.

Tapering both the side faces 52 of the protruding portion 5 as illustrated in FIG. 12 prevents the occurrence of cracks from such a protruding portion 5 as a starting point.

The formation of the Ni-plated portion 63 in the central region of one major surface 41 of the second sealing member 4, as viewed in plane, prevents the bonding materials 7 from being physically diffused toward the central region of one major surface 41 of the second sealing member 4 as viewed in plane and also prevents the bonding materials 7 from wetting (flowing to) the central region side of one major surface 41 of the second sealing member 4 as viewed in plane. The formation of the Ni-plated portion 63 in the central region of one major surface 41 of the second sealing member 4 as viewed in plane also allows countermeasures against EMI to be taken with the crystal resonator 1, thus complementing the strength of the second sealing member 4 as a lid. Note that, in the present embodiment, while the spread preventing portion is an Ni-plated portion 63, the present invention is not limited thereto; the spread preventing portion may be any other member as long as it is a metal film that prevents bonding materials from being diffused physically. Specifically, such a metal film may be configured by forming a Cr layer instead of the Ni-plated layer 631, in which case it is possible to prevent the bonding materials 7 from being diffused toward the central region of one major surface 41 of the second sealing member 4 as viewed in plane.

Also, in the case of FIG. 12, while a side face of the recessed portion 61 is formed perpendicular to one major surface 41 of the second sealing member 4, the present invention is not limited thereto. For example, a side face of the recessed portion 61 may be tapered with respect to one major surface 41 of the second sealing member 4 as illustrated in FIG. 13.

Figure 14:
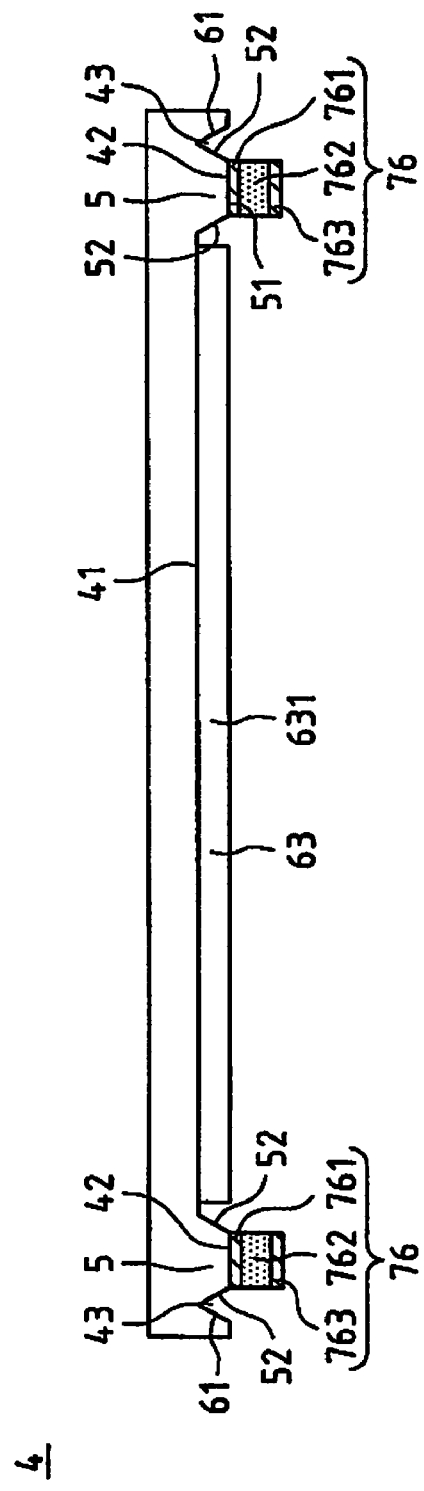
FIG. 14 is a schematic structural diagram of a second sealing member according to another embodiment of the present invention.

Also, in the case of FIG. 12, while the bottom face of the groove 43 is formed in the same plane as one major surface 41 of the second sealing member 4, the present invention is not limited thereto; for example, the groove 43 may be formed by the tapered side face 52 of the protruding portion 5 and a tapered side face of the recessed portion 61 so that the bottom of the groove 43 has a wedge-shaped (V-shaped) cross section as illustrated in FIG. 14.

Figure 13:
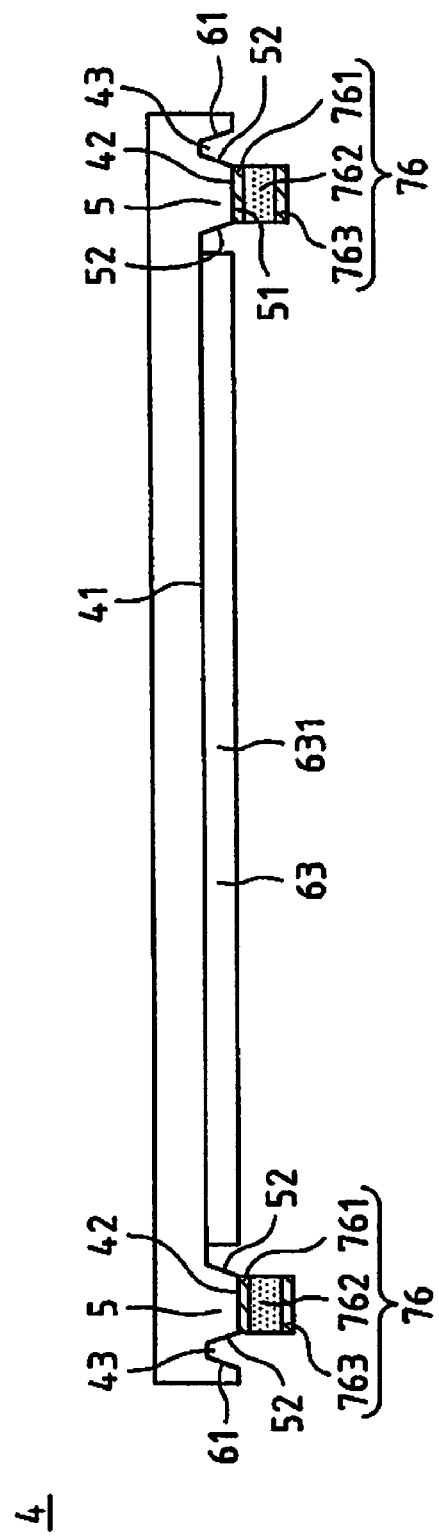
FIG. 13 is a schematic structural diagram of a second sealing member according to another embodiment of the present invention.
Figure 15:
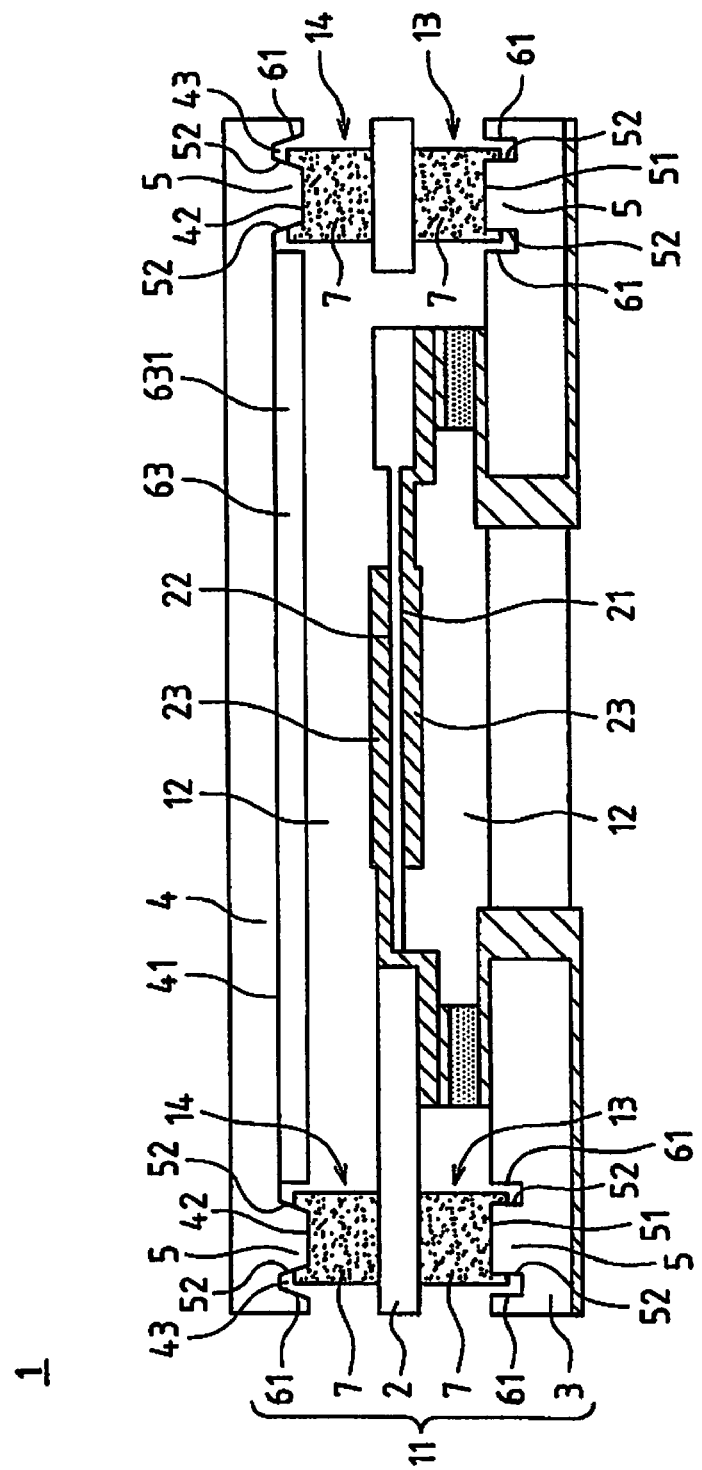
FIG. 15 is a schematic side view showing an internal space of a crystal resonator in which the structure of the second sealing member illustrated in FIG. 13 is applied to the second sealing member illustrated in FIG. 1 according to an embodiment of the present invention.

Note that the embodiments of both the multiple-surface bonding portion and the spread preventing portion of the second sealing member 4 illustrated in FIGS. 12 to 14 may be applied to the second sealing member 4 illustrated in FIGS. 10 and 11 and may also be applied to the multiple-surface bonding portion and the spread preventing portion of the crystal resonator plate 2, the first sealing member 3, and the second sealing member 4 of the crystal resonator illustrated in FIGS. 1 to 9. As a concrete example, FIG. 15 is a schematic side view showing an internal space of a crystal resonator 1 that applies the second sealing member 4 illustrated in FIG. 13 to the second sealing member 4 of the present embodiment illustrated in FIG. 1.

It should be noted that the present invention can be implemented in a variety of other forms without departing from its spirit, gist or main features. For this reason, the above-described embodiments are to all intents and purposes merely illustrative and should not be construed as limiting. The scope of the present invention is indicated by the claims and is not in any way restricted by the text of the Detailed Description. Furthermore, all variations and modifications of the claims within the scope of equivalency fall within the purview of the present invention.

In addition, this Application claims priority rights from Japanese Patent Application No. 2008-171091 filed on Jun. 30, 2008 in Japan. Its entire contents are incorporated in this Application by reference.

INDUSTRIAL APPLICABILITY

The present invention is applicable to a piezoelectric resonator plate, such as a crystal resonator plate, that uses quartz for the material of a substrate; a piezoelectric resonator device; and a method for manufacturing such a piezoelectric resonator plate.

The invention claimed is:

1. A piezoelectric resonator device that generates piezoelectric resonance, comprising:
    a piezoelectric resonator plate made of a piezoelectric material and having driving electrodes formed on both its major surfaces; a first sealing member that hermetically seals the driving electrode formed on one of the major surfaces of the piezoelectric resonator plate; and a second sealing member that hermetically seals the driving electrode formed on the other major surface of the piezoelectric resonator plate, wherein
    the piezoelectric resonator plate and the first sealing member are bonded together with a bonding material, and the piezoelectric resonator plate and the second sealing member are bonded together with a bonding material; and
    a multiple-surface bonding portion and a spread preventing portion are provided in at least either of a bonding area between the piezoelectric resonator plate and the first sealing member and a bonding area between the piezoelectric resonator plate and the second sealing member, the multiple-surface bonding portion allowing the bonding material to be bonded to a plurality of surfaces of different surface orientations, the spread preventing portion being located on an outer side of the multiple-surface bonding portion and preventing a bonding region bonded to the bonding material from being enlarged.

2. A piezoelectric resonator device that generates piezoelectric resonance, wherein
    a first sealing member and a second sealing member are laminated and bonded together via a piezoelectric resonator plate that is made of a piezoelectric material and that has driving electrodes formed on both its major surfaces, the first sealing member hermetically sealing the driving electrode formed on one of major surfaces of the piezoelectric resonator plate, the second sealing member hermetically sealing the driving electrode formed on the other major surface of the piezoelectric resonator plate;
    a first bonding material for bonding the first sealing member and a second bonding material for bonding the second sealing member are formed on bonding surfaces of the piezoelectric resonator plate;
    a third bonding material for bonding the piezoelectric resonator plate is formed on a bonding surface of the first sealing member;
    a fourth bonding material for bonding the piezoelectric resonator plate is formed on a bonding surface of the second sealing member;
    the first bonding material and the third bonding material are bonded together to form a bonding material, with which the piezoelectric resonator plate and the first sealing member are bonded together so as to hermetically seal the driving electrode formed on one of the major surfaces of the piezoelectric resonator plate;

the second bonding material and the fourth bonding material are bonded together to form a bonding material, with which the piezoelectric resonator plate and the second sealing member are bonded together so as to hermetically seal the driving electrode formed on the other major surface of the piezoelectric resonator plate; and a multiple-surface bonding portion and a spread preventing portion are provided in at least either of a bonding area between the piezoelectric resonator plate and the first sealing member and a bonding area between the piezoelectric resonator plate and the second sealing member, the multiple-surface bonding portion allowing the bonding material to be bonded to a plurality of surfaces of different surface orientations, the spread preventing portion being located on an outer side of the multiple-surface bonding portion and preventing a bonding region bonded to the bonding material from being enlarged.

3. The piezoelectric resonator device according to claim 2, wherein a bonding region of the first bonding material on the bonding surface of the piezoelectric resonator plate and a bonding region of the third bonding material on the bonding surface of the first sealing member have the same width, and a bonding region of the second bonding material on the bonding surface of the piezoelectric resonator plate and a bonding region of the fourth bonding material on the bonding surface of the second sealing member have the same width.

4. A piezoelectric resonator device that generates piezoelectric resonance, comprising:

a piezoelectric resonator plate that is made of a piezoelectric material and has driving electrodes formed on both its major surfaces; a first sealing member that is equipped with the piezoelectric resonator plate; and a second sealing member that is bonded to the first sealing member with a bonding material so as to hermetically seal the driving electrodes of the piezoelectric resonator plate, wherein the first sealing member and the second sealing member are bonded together with the bonding material; and a multiple-surface bonding portion and a spread preventing portion are provided in a bonding area between the first sealing member and the second sealing member, the multiple-surface bonding portion allowing the bonding material to be bonded to a plurality of surfaces of different surface orientations, the spread preventing portion being located on an outer side of the multiple-surface bonding portion and preventing a bonding region bonded to the bonding material from being enlarged.

5. A piezoelectric resonator device that generates piezoelectric resonance, comprising:

a piezoelectric resonator plate that is made of a piezoelectric material and has driving electrodes formed on both its major surfaces; a first sealing member that is equipped with the piezoelectric resonator plate; and a second sealing member that is bonded to the first sealing member with a bonding material so as to hermetically seal the driving electrodes of the piezoelectric resonator plate, wherein a fifth bonding material for bonding the second sealing member is formed on a bonding surface of the first sealing member;

a sixth bonding material for bonding the first sealing member is formed on a bonding surface of the second sealing member;

a multiple-surface bonding portion and a spread preventing portion are provided in a bonding area between the first sealing member and the second sealing member, the multiple-surface bonding portion allowing the bonding material to be bonded to a plurality of surfaces of different surface orientations, the spread preventing portion being located on an outer side of the multiple-surface bonding portion and preventing a bonding region bonded to the bonding material from being enlarged; and the fifth bonding material and the sixth bonding material are bonded together to form the bonding material, with which the first sealing member and the second sealing member are bonded together so as to hermetically seal the driving electrodes formed on the piezoelectric resonator plate.

6. The piezoelectric resonator device according to claim 5, wherein a bonding region of the fifth bonding material on the bonding surface of the first sealing member and a bonding region of the sixth bonding material on the bonding surface of the second sealing member have the same width.

7. The piezoelectric resonator device according to claim 1, wherein a multiple-surface bonding portion and a spread preventing portion are provided in the bonding area between the piezoelectric resonator plate and the first sealing member and in the bonding area between the piezoelectric resonator plate and the second sealing member, the multiple-surface bonding portion allowing the bonding material to be bonded to a plurality of surfaces of different surface orientations, the spread preventing portion being located on an outer side of a bonding area using the bonding material and preventing a bonding region bonded to the bonding material from being enlarged.

8. The piezoelectric resonator device according to claim 1, wherein the multiple-surface bonding portion is a protruding portion that has a plurality of surfaces and is formed in at least either of the bonding area between the piezoelectric resonator plate and the first sealing member and the bonding area between the piezoelectric resonator plate and the second sealing member, and the bonding material is bonded to a plurality of surfaces that include an end face of the protruding portion.

9. The piezoelectric resonator device according to claim 1, wherein the spread preventing portion is a recessed portion formed on an outer side of the multiple-surface bonding portion.

10. The piezoelectric resonator device according to claim 1, wherein the spread preventing portion is a protruding wall portion formed on an outer side of the multiple-surface bonding portion.

11. The piezoelectric resonator device according to claim 1, wherein the spread preventing portion is a metal film formed on an outer side of the multiple-surface bonding portion.

12. The piezoelectric resonator device according to claim 1, wherein the bonding surfaces of the piezoelectric resonator plate, the first sealing member, and the second sealing member in the bonding areas are smooth surfaces.

* * * * *